US010680041B2

(12) United States Patent
Li et al.

(10) Patent No.: US 10,680,041 B2
(45) Date of Patent: Jun. 9, 2020

(54) PIXEL ARRANGEMENT STRUCTURE AND RELATED APPARATUS

(71) Applicant: BOE TECHNOLOGY GROUP CO., LTD., Beijing (CN)

(72) Inventors: Yansong Li, Beijing (CN); Haidong Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/330,925

(22) PCT Filed: Aug. 1, 2018

(86) PCT No.: PCT/CN2018/097948
§ 371 (c)(1),
(2) Date: Mar. 6, 2019

(87) PCT Pub. No.: WO2019/134363
PCT Pub. Date: Jul. 11, 2019

(65) Prior Publication Data
US 2020/0127060 A1    Apr. 23, 2020

(30) Foreign Application Priority Data
Jan. 2, 2018   (CN) .......................... 2018 1 0002725

(51) Int. Cl.
*H01L 27/32* (2006.01)
(52) U.S. Cl.
CPC ...... *H01L 27/3216* (2013.01); *H01L 27/3213* (2013.01); *H01L 27/3218* (2013.01)

(58) Field of Classification Search
CPC ............. H01L 27/3216; H01L 27/3218; H01L 27/3213
See application file for complete search history.

(56) References Cited

U.S. PATENT DOCUMENTS

| 9,818,803 B2 | 11/2017 | Lee |
| 2015/0015465 A1 | 1/2015 | Gong |
| 2018/0088260 A1 | 3/2018 | Jin et al. |

FOREIGN PATENT DOCUMENTS

| CN | 103311266 A | 9/2013 |
| CN | 105529353 A | 4/2016 |
| CN | 205355055 U | 6/2016 |
| CN | 107871775 A | 4/2018 |
| CN | 207966984 U | 10/2018 |

OTHER PUBLICATIONS

International Search Report dated Nov. 6, 2018, issued in counterpart application No. PCT/CN2018/097948. (12 pages).

*Primary Examiner* — Anthony Ho
(74) *Attorney, Agent, or Firm* — Westerman, Hattori, Daniels & Adrian, LLP

(57) ABSTRACT

The present disclosure is related to a pixel arrangement structure. The pixel arrangement structure may include a plurality of first repeating units and a plurality of second repeating units alternately arranged in both a first direction and a second direction. Each of the plurality of the first repeating units may comprise a first sub-pixel or a second sub-pixel, and each of the plurality of the second repeat units may comprise a third sub-pixel or a second sub-pixel. Second sub-pixels may be uniformly distributed in an array. At least some of first sub-pixels have a shape of a concave polygon, and at least some of third sub-pixels have a shape of a convex polygon.

20 Claims, 7 Drawing Sheets

PIXEL ARRANGEMENT STRUCTURE AND RELATED APPARATUS

CROSS-REFERENCE TO RELATED APPLICATIONS

This application claims benefit of the filing date of Chinese Patent Application No. 201810002725.2 filed on Jan. 2, 2018, the disclosure of which is hereby incorporated in its entirety by reference.

TECHNICAL FIELD

The present disclosure relates to display technologies, and in particular, to a pixel arrangement structure, an organic light emitting diode display panel, a high-precision metal mask, and a display apparatus.

BACKGROUND

Compared with liquid crystal display apparatuses, Organic Light Emitting Diode (OLED) display apparatuses have low energy consumption, low production cost, self-luminescence, wide viewing angle, quick response speed, and other advantages. At present, in the flat panel displays such as mobile phones, PDAs, and digital cameras, OLED display apparatuses have begun to replace the traditional liquid crystal display (LCD) apparatuses.

The structure of the OLED display apparatus mainly includes a base substrate and sub-pixels arranged in an array on the base substrate. Each of the sub-pixels is generally made of organic material and formed by an evaporation film-forming technique using a high-precision metal mask. Organic electroluminescent structures are formed at corresponding sub-pixel positions on the array substrate.

However, in the current OLED display apparatus, the distance among the sub-pixels in the pixel arrangement structure is relatively large, thereby resulting in smaller sub-pixel opening region at a same resolution ratio. As such, it is necessary to increase the driving current to meet the display brightness requirement. However, the large driving current tends to increase aging speed of the OLED display apparatus, thereby shortening service life of the OLED display apparatus. Also, since sub-pixels of various colors have very different light-emitting structures, some light-emitting structures such as red light-emitting structures decay more slowly while some light-emitting structures such as blue light-emitting structures decay more quickly. The difference in the speed of brightness decay of sub-pixels in the OLED display apparatus also shortens the lifetime of the OLED display apparatus.

BRIEF SUMMARY

An embodiment of the present disclosure provides a pixel structure. The pixel structure may include a plurality of first repeating units and a plurality of second repeating units alternately arranged in both a first direction and a second direction respectively. Each of the plurality of the first repeating units may include a first sub-pixel or a second sub-pixel, and each of the plurality of the second repeat units may include a third sub-pixel or a second sub-pixel. Second sub-pixels may be uniformly distributed in an array. at least some of first sub-pixels may have a shape of a concave polygon, and at least some of third sub-pixels may have a shape of a convex polygon. Four second sub-pixels may surround one first sub-pixel or one third sub-pixel, which is adjacent to the four sub-pixels.

The convex polygon may include a first base pattern and at least one convex pattern protruding from the base pattern. The concave polygon may include a second base pattern minus at least one sub-pattern. A contour of the convex pattern and a contour of the sub-pattern may have similar patterns.

The convex polygon and the concave polygon may be complementary to each other. Each of the third sub-pixels may be an axisymmetric pattern. Each of the first sub-pixels may be an axisymmetric pattern. Each of the second sub-pixels may be an axisymmetric pattern. A symmetrical axis of each of the third sub-pixels may be substantially in the first direction rotated clockwise by an angle in a range of 40-50°. A symmetrical axis of each of the first sub-pixels may be substantially in the first direction rotated clockwise by an angle in a range of 40°-50°. A symmetrical axis of each of the second sub-pixels may be substantially in the first direction rotated clockwise by an angle in a range of 40°-50°.

All the third sub-pixels may have the same shape of the convex polygon. The second sub-pixel may include a third-type sub-pixel or a fourth-type sub-pixel, the third-type sub-pixel and the fourth-type sub-pixel may have different shapes, and an area of the third-type sub-pixel may be larger than an area of the fourth-type sub-pixel. Shapes of the third sub-pixel and the first sub-pixel may be complementary to each other. At least some of first sub-pixels may have a shape of rectangle, at least some of second sub-pixels may have a shape of rectangle, and/or at least some of third sub-pixels may have a shape of a rectangle. All the first sub-pixels may have the same shape of the concave polygon. The third sub-pixel may be complementary to at least one adjacent second sub-pixel; and the first sub-pixel may be complementary to at least one adjacent second sub-pixel.

The first sub-pixel may include a first-type sub-pixel or a second-type sub-pixel, the first-type sub-pixel and the second-type sub-pixel may have different shapes, and an area of the first-type sub-pixel may be larger than an area of the second-type sub-pixel. The first-type sub-pixel may have a shape of the second base pattern, and the second-type sub-pixel may have a shape of the second base pattern minus two opposite sub-patterns. The first-type sub-pixels may be arranged in a line of the first direction and a line of the second direction respectively. The second-type sub-pixels may be arranged in the line of the first direction and the line of the second direction respectively. A line of first-type sub-pixels in the first direction and a line of the second-type sub-pixels in the first direction may be alternately arranged in the second direction, and a line of the first-type sub-pixels in the second direction and a line of the second-type sub-pixels in the second direction may be alternately arranged in the first direction.

The third-type sub-pixels and the fourth-type sub-pixels may be alternately arranged in the first direction and the second direction respectively.

The third-type sub-pixel and the third sub-pixel may have a same shape and/or the fourth-type sub-pixels and the first sub-pixel may have a same shape. The third sub-pixel and the third-type sub-pixel may have a same shape of a convex pentagon, two interior angles of the convex pentagon may be respectively about 90°, and the other three interior angles may be respectively greater than about 90°. The first sub-pixel and the fourth-type sub-pixel may have a same shape of a concave pentagon, two interior angles of the concave pentagon may be respectively about 90°, one interior angle may be greater than 180°, and the other two interior angles may be respectively acute angles. One side of the convex pentagon may be an arc. The interior angles may be rounded interior angles.

A ratio of a maximum distance and a minimum distance between opposite sides of the third sub-pixel and the adjacent second sub-pixel may be in a range of 1 to 1.5. A ratio of a maximum distance and a minimum distance between opposite sides of the first sub-pixel and the adjacent second sub-pixel may be in a range of 1 to 1.5. The opposite sides of the third sub-pixel and the adjacent second sub-pixel may be substantially parallel to each other; and the opposite sides of the first sub-pixel and the adjacent second sub-pixel may be substantially parallel to each other. A sum of areas of the third sub-pixels may be not less than twice a sum of areas of the first sub-pixels and a sum of the areas of the second sub-pixels may be smaller than the sum of the areas of the third sub-pixels. The sum of the areas of the second sub-pixels may be greater than the sum of the areas of the first sub-pixels.

Another example of the present disclosure is a display apparatus. The display apparatus may include a display panel which includes the pixel structure according to one embodiment of the present disclosure.

Another example of the present disclosure is a high-precision metal mask used for manufacturing the pixel arrangement structure according to one embodiment of the present disclosure. The precision metal mask may include a plurality of opening areas, the opening areas corresponding to shapes and positions of the first sub-pixels, the second sub-pixels or the third sub-pixels respectively.

DETAILED DESCRIPTION

Figure 1:
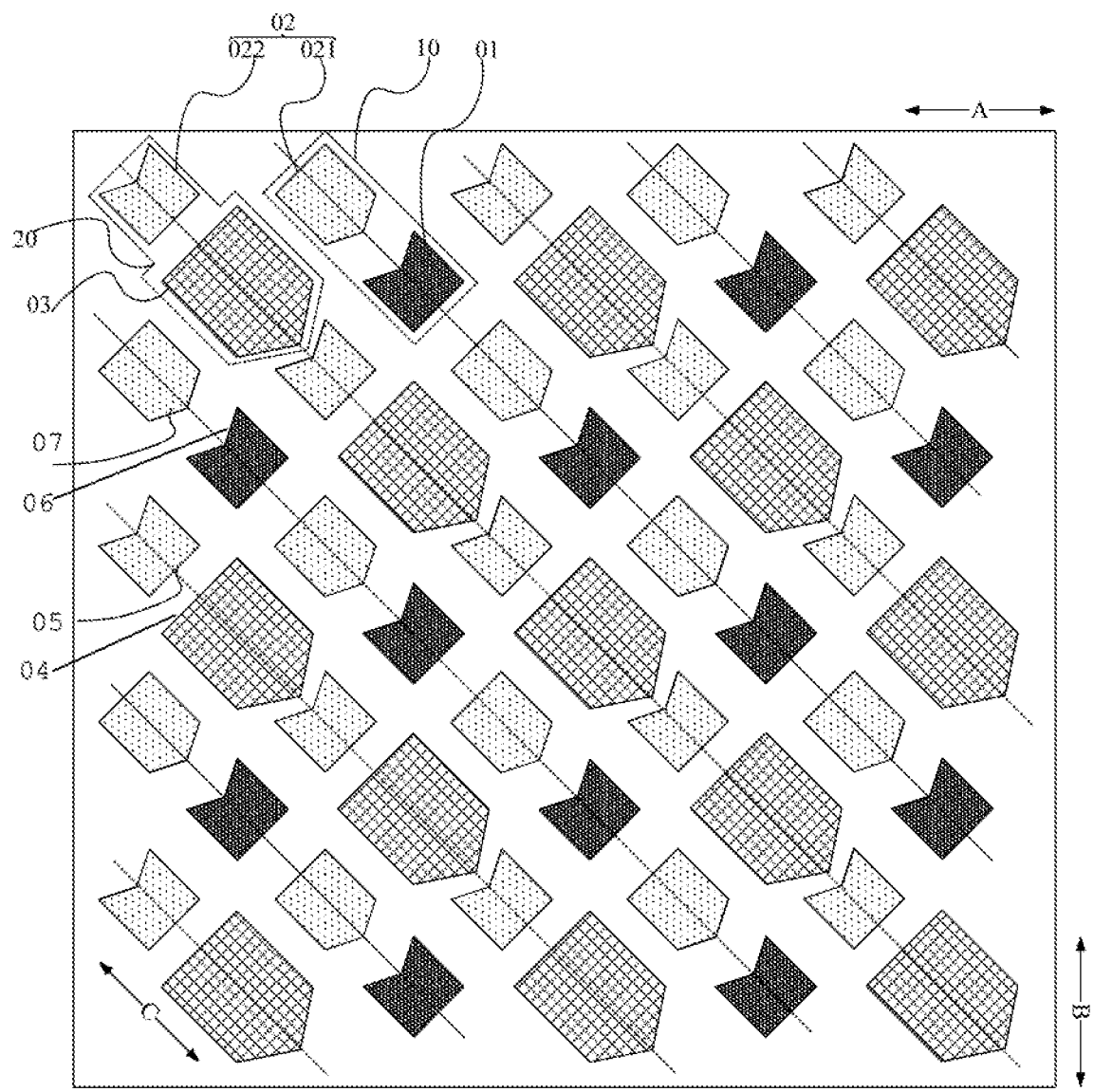
FIG. 1 is a schematic diagram of a pixel arrangement structure according to an embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-7. When referring to the figures, like structures and elements shown throughout are indicated with like reference numerals.

The shapes and sizes of components in the drawings do not reflect true scale and are only intended to schematically illustrate content of the present disclosure.

An embodiment of the present disclosure provides a pixel arrangement structure, as shown in FIGS. 1 to 4. The pixel arrangement structure includes a plurality of first repeating units 10 and a plurality of second repeating units 20, which are alternately arranged in both the row direction A and the column direction B.

The first repeating unit 10 includes a first sub-pixel 01 or a second sub-pixel 02, and the second repeating unit 20 includes a third sub-pixel 03 or a second sub-pixel 02.

The second sub-pixels 02 are uniformly distributed in an array. Every four second sub-pixels 02 surround a first sub-pixel 01 or a third sub-pixel 03.

At least some of the first sub-pixels 01 have a shape of a concave polygon. At least some of the third sub-pixels 03 have a shape of a convex polygon.

Figure 5:
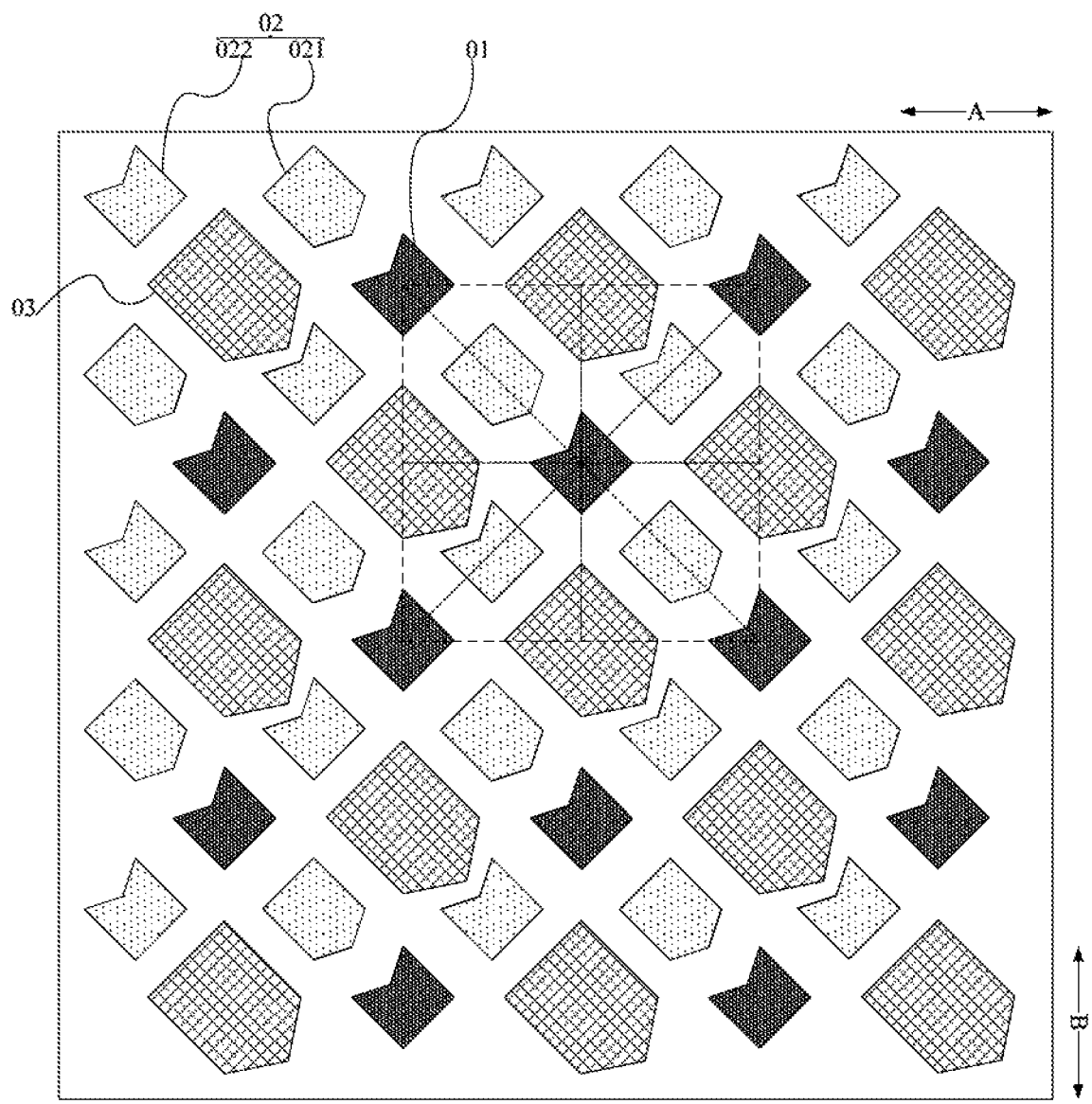
FIG. 5 is a schematic diagram of a pixel arrangement structure according to an embodiment of the present disclosure.

In one embodiment, the pixel arrangement structure, as shown in FIG. 5, can be considered to include a plurality of first virtual rectangles (indicated by dashed boxes in FIG. 5) arranged closely in a matrix.

The first sub-pixels 01 are respectively located at the center point and the four diagonal points of the first virtual rectangle.

The third sub-pixels 03 are respectively located at the middle points of four sides of the first virtual rectangle.

The second sub-pixel 02 is located in a second virtual rectangle. Two adjacent third sub-pixels 03, a first sub-pixel 01 located at the center of the first virtual rectangle, and a first sub-pixel 01 at any diagonal position of the first virtual rectangle constitute respectively four vertices of the second virtual rectangle. Four second virtual rectangles constitute a first virtual rectangle.

At least some of the first sub-pixels 01 have a shape of a concave polygon, and at least some of the third sub-pixels 03 have a shape of a convex polygon.

It should be noted that, in the foregoing pixel arrangement structure provided by the embodiment of the present disclosure, the sub-pixel being located at a certain point refers to a range of sub-pixel positions where the sub-pixel overlaps the certain point. In one embodiment, the center of the sub-pixel overlaps the certain point. In another embodiment, the center of the sub-pixel does not overlap the certain point, that is, there is a deviation between them, which is not limited herein. In addition, the center of the sub-pixel may be a geometric center of the sub-pixel pattern or a center of light emission color of the sub-pixel, which is not limited herein.

In one embodiment, in the foregoing pixel arrangement structure, in order to ensure uniform distribution of the sub-pixels, the center of each of the pixels is as close to the corresponding point as possible.

It should be noted that, the first virtual rectangle mentioned in the display arrangement structure provided by the embodiment of the present disclosure is the largest dashed box in FIG. 5. The second virtual rectangle is the small dashed box in FIG. 5. The first virtual rectangle includes four second virtual rectangles, as shown in FIG. 5. The first virtual rectangle and the second virtual rectangle may be rectangular or square, which is not limited herein.

In one embodiment, compared with the conventional pixel arrangement structure, the above pixel arrangement structure provided by the embodiment of the present disclosure can make the first sub-pixels 01, the second sub-pixels 02, and the third sub-pixels 03 closely arranged under the same processing parameters, thereby reducing the spacing between adjacent sub-pixels as much as possible. As such, under the same resolution, the pixel opening region can be increased and the driving current of the display apparatus can be reduced, thereby increasing the lifetime of the display apparatus. In addition, the aperture ratio of the first sub-pixel 01 is reduced by adopting a shape of a concave polygon. The reduced aperture ratio can be added to the third sub-pixel 03 by changing the shape of the third sub-pixel 03 to a convex polygon. Increasing the aperture ratio of the third sub-pixel 03 can compensate for the fast decay of brightness of the third sub-pixel 03 and balance the difference in brightness decay speed among the sub-pixels, thereby increasing the lifetime of the display apparatus.

In the pixel arrangement structure provided in one embodiment of the present disclosure, that every four second sub-pixels 02 surround a first sub-pixel 01 or a third sub-pixel 03 and the second sub-pixel 02 are uniformed distributed in an array generally refers to the arrangement of pixels located in the central area of the display panel. There may appear some special circumstances at the edge of the display panel. For example, the first sub-pixel 01 and the third sub-pixel 03 at the edge may be alternately arranged, and the first sub-pixel 01 and the third sub-pixel 03 at the edge are not surrounded by the second sub-pixels 02.

Figure 7:
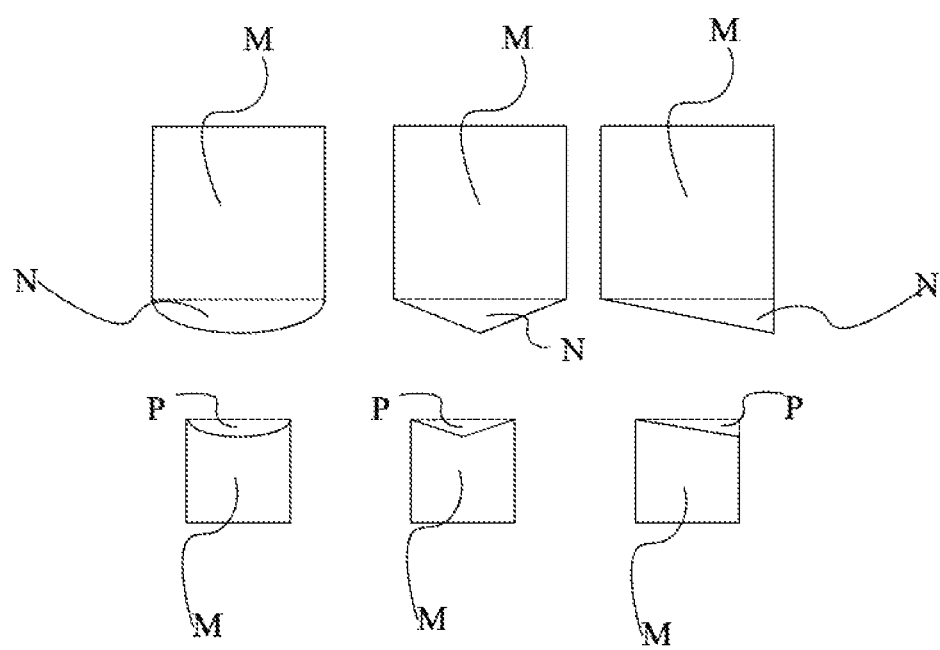
FIG. 7 is a schematic diagram of shapes of a concave polygon and a convex polygon in a pixel arrangement structure provided by an embodiment of the present disclosure.

In one embodiment, in the above pixel arrangement structure provided in the embodiment of the present disclosure, as shown in FIG. 7, the convex polygon includes a base pattern M and a protruding pattern N protruding from the base pattern M. The concave polygon includes a base pattern M minus at least one sub-pattern P. The protruding pattern N and the sub-pattern P are similar patterns.

It is worth noting that similar patterns refer to the fact that the two patterns have the same shape, but with the same or different areas. In addition, the base pattern M used for the convex polygon and the base pattern M used for the concave polygon have the same shape, and the areas thereof may be the same or different.

In one embodiment, the base pattern M is generally a rectangle, and of course, it may be other polygons such as a pentagon, a hexagon, etc. Of course, the base pattern M may also be a circle, an ellipse, or the like formed by arcs, which are not limited herein. In FIGS. 1 to 4, the base pattern M is schematically illustrated as a rhombic shape.

In one embodiment, the protruding pattern N and the sub-pattern P are generally triangles. Of course, other polygonal shapes such as a quadrangle, a pentagon, a hexagon, etc. may be used. Of course, the protruding pattern N and the sub-pattern P may also be the shapes formed by arcs, such as semicircle and semi-ellipsoids, which are not limited herein.

In one embodiment, the protruding pattern N protruding from the base pattern M may be disposed on any side of the base pattern M or on a plurality of sides of the base pattern M, and the number of sides is not limited. In FIG. 7, the protruding pattern N protruding from one side of the base pattern M is described as an example.

In one embodiment, the sub-pattern P from the concave polygon may be located on any side of the base pattern M, and the base pattern M may have the sub-pattern P on a plurality of sides, that is, the sub-pattern P may be set in any sides of the base pattern M. Furthermore, the number of sides is not limited. In FIG. 7, the sub-pattern P located on one side of the base pattern M is described as an example.

An absolute distance of a point on a side to an opposite side refers to the shortest distance from the point on the side to the opposite side. The minimum distance between the opposite sides refers to the smallest absolute distance among the absolute distances of all points on the side to the opposite side. The maximum distance between the opposite sides refers to the largest absolute distance among the absolute distances of all points on the side to the opposite side.

In one embodiment, in the pixel arrangement structure, the minimum distance between opposite sides of a third sub-pixel 03 and an adjacent second sub-pixel 02 needs to be greater than or equal to the process limit distance. The opposite sides of the third sub-pixel and the adjacent second sub-pixel means a first side of the third sub-pixel 04 directly opposite the adjacent second sub-pixel and a second side of the adjacent second sub-pixel 05 directly opposite the first side of the third sub-pixel. The minimum distance between opposite sides of a first sub-pixel 01 and an adjacent second sub-pixel 02 needs to be greater than or equal to the process limit distance to meet the process requirements.

Specifically, the process limit distance is generally related to the manufacturing process used. When a pixel pattern is formed by using a high-precision metal mask (FMM) and an etching process, the process limit distance is about 16 μm. When a pixel pattern is formed using a laser or electroforming process, the process limit distance is smaller.

Optionally, in the pixel arrangement structure provided by one embodiment of the present disclosure, in order to enable the second sub-pixels 02 to be uniformly distributed in the pixel arrangement structure to reduce the spacing between the second sub-pixel 02s and the adjacent first sub-pixels 01 and the spacing between the third sub-pixel 03 and the adjacent second sub-pixel 02, the second sub-pixel 02 may be located at the intersection point of the connecting line between two adjacent first sub-pixels 01 and the connecting line between two adjacent third sub-pixels 03, as shown in FIG. 5.

Optionally, the specific shapes, positional relationships, parallelism, and angle relationships of the second sub-pixels 02, the first sub-pixels 01, and the third sub-pixels 03 may be designed according to requirements. In the actual process, because of limitation in process conditions or other factors, there may be some deviations. As long as the shapes, positions and relative positions of each sub-pixel satisfy the above conditions, they all belong to the pixel arrangement structure provided by the embodiments of the present disclosure.

Optionally, in the pixel arrangement structure provided in one embodiment of the present disclosure, the ratio between the maximum distance and the minimum distance between opposite sides of a third sub-pixel 03 and an adjacent second sub-pixel 02 is in the range of 1 to 1.5. The opposite sides of the third sub-pixel and the adjacent second sub-pixel means a first side of the third sub-pixel 04 directly opposite the adjacent second sub-pixel and a second side of the adjacent second sub-pixel 05 directly opposite the first side of the third sub-pixel, as shown in FIG. 1. Specifically, for example, it may be 1.1, 1.2, 1.3, or 1.4. Similarly, the ratio between the maximum distance and the minimum distance between opposite sides of a first sub-pixel 01 and an adjacent second sub-pixel 02 ranges from 1 to 1.5. The opposite sides of the first sub-pixel and the adjacent second sub-pixel means a first side of the first sub-pixel 06 directly opposite the adjacent second sub-pixel and a third side of the adjacent second sub-pixel 07 directly opposite the first side of the first sub-pixel, as shown in FIG. 1. Specifically, for example, it may be 1.1, 1.2, 1.3, or 1.4. In addition, when the ratio between the maximum distance and the minimum distance between opposite sides of a second sub-pixel 02 and an adjacent first sub-pixel 01 (or an adjacent third sub-pixel 03) is larger than 1, it illustrates that the shapes of the opposite sides are not consistent.

Optionally, in the pixel arrangement structure provided in one embodiment of the present disclosure, in order to ensure that the gap width between a third sub-pixel 03 and an adjacent second sub-pixel 02 is the same and reduce the spacing between the third sub-pixel 03 and the adjacent second sub-pixel 02, the opposite sides of the third sub-pixel 03 and the adjacent second sub-pixel 02 may be substantially parallel to each other, as shown in FIGS. 1 to 5. Also, the shapes of the opposite sides of the third sub-pixel 03 and the adjacent second sub-pixel 02 can be substantially complementary to each other to achieve the parallelism. Of course, in the specific implementation, the opposite sides of the third sub-pixel 03 and the adjacent second sub-pixel 02 may not be parallel, which is not limited herein.

Optionally, in the pixel arrangement structure provided by one embodiment of the present disclosure, in order to ensure that the gap width between a second sub-pixel 02 and an adjacent first sub-pixel 01 is the same and reduce the spacing between the second sub-pixel 02 and the adjacent first sub-pixel 01, the opposite sides of the second sub-pixel 02 and the adjacent first sub-pixel 01 may be substantially parallel to each other, as shown in FIGS. 1 to 5. Also, the shapes of the opposite sides of the second sub-pixel 02 and the adjacent first sub-pixel 01 may be substantially complementary to each other to achieve the parallelism. Of course, in the specific implementation, the opposite sides of the second sub-pixel 02 and the adjacent first sub-pixel 01 may not be parallel, which is not limited herein.

Figure 6:
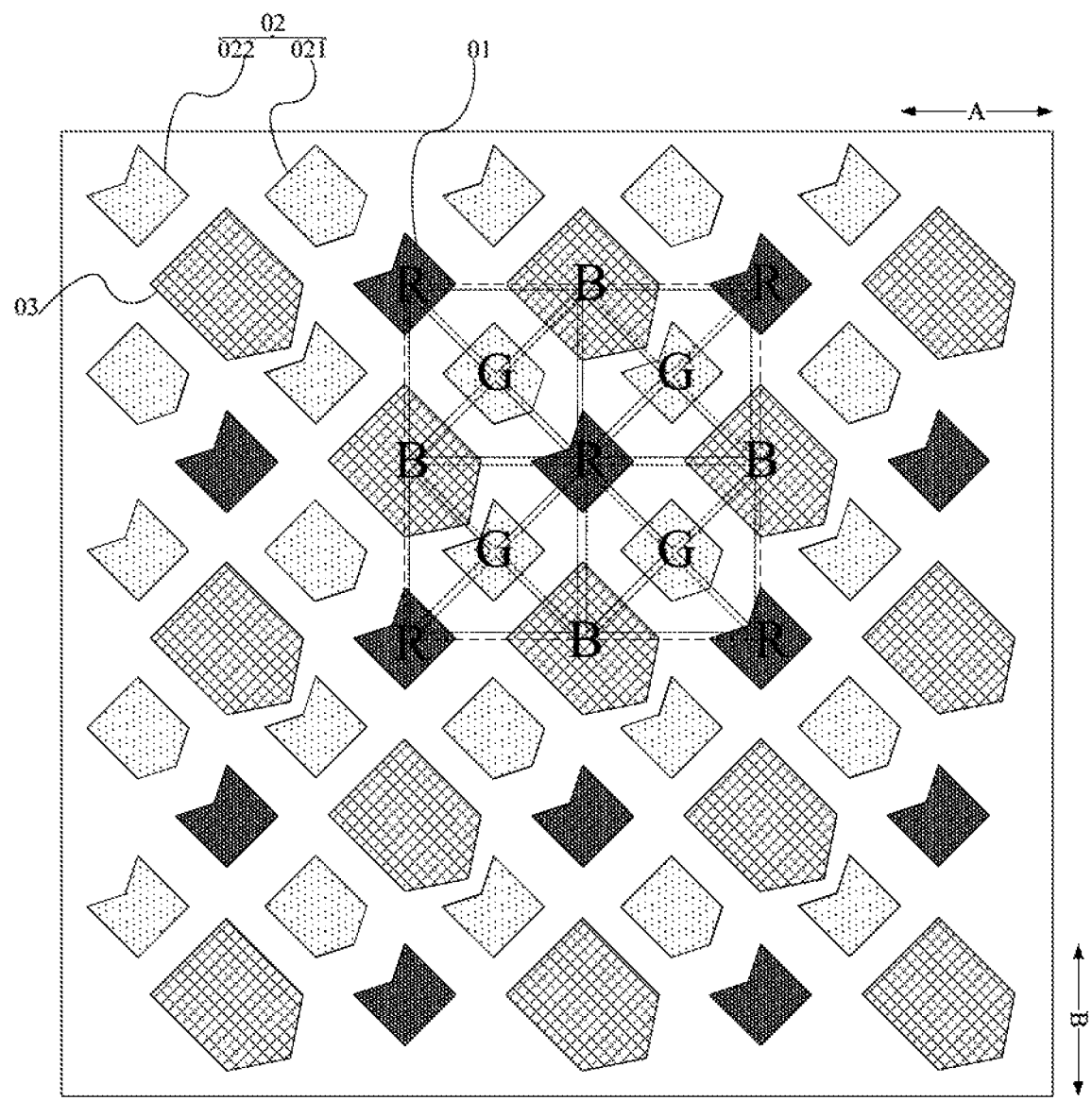
FIG. 6 is a schematic diagram of a pixel arrangement structure according to an embodiment of the present disclosure.

In the pixel arrangement structure provided in one embodiment of the present disclosure, brightness of the blue light-emitting structure among the current light-emitting structures decays the fastest, and brightness of the red light-emitting structure decays relatively slower. Therefore, as shown in FIG. 6, the first sub-pixel 01 may be a red sub-pixel R, the second sub-pixel 02 may be a green sub-pixel G, and the third sub-pixel 03 may be a blue sub-pixel B. By decreasing the aperture ratio of the red sub-pixel R and increasing the aperture ratio of the blue sub-pixel B, the faster decayed brightness of the blue sub-pixel B is compensated so as to balance the difference in the brightness decay speed among the sub-pixels, thereby increasing the lifetime of the display apparatus. Moreover, as shown in FIG. 6, a green sub-pixel G located at a center of a second virtual rectangle, a red sub-pixel R and a blue sub-pixel B located at two adjacent vertices of the second virtual rectangle may constitute one light-emitting pixel point.

Optionally, in the pixel arrangement structure provided by one embodiment of the present disclosure, in order to balance the differences in brightness decay speed among sub-pixels, a sum of areas of the third sub-pixels 03 is generally not less than two times of a sum of areas of first sub-pixels 01. Moreover, since the human eye is relatively sensitive to green light, a sum of areas of the second sub-pixels 02, that is, the aperture ratio, may be greater than a sum of areas of the first sub-pixels 01, that is, the aperture ratio. A sum of areas of the second sub-pixels 02, that is, the aperture ratio, may be smaller than a sum of areas of the third sub-pixels 03, that is, the aperture ratio.

Optionally, in the pixel arrangement structure provided by one embodiment of the present disclosure, as shown in FIGS. 1 to 4, the third sub-pixel 03 may be asymmetrical with respect to the extension lines of the row direction A and the column direction B respectively. At least the first sub-pixel 01 having a shape of a concave polygon may be asymmetrical with respect to the extension lines of the row direction A and the column direction B respectively. The second sub-pixel 02 may be asymmetrical with respect to the extension lines of the row direction A and the column direction B respectively. The row direction A and the column direction B refer to the direction of the row or column respectively where the sub-pixels are located. In other words, each sub-pixel is asymmetrical with respect to both the vertical and horizontal directions.

Optionally, in the pixel arrangement structure provided in one embodiment of the present disclosure, as shown in FIGS. 1 to 4, the third sub-pixel 03 may be symmetrical with respect to an extension line of the diagonal direction C. That is, the sub-pixel 03 is an axisymmetric pattern, and the direction of the symmetrical axis of the third sub-pixel 03 is a direction of the row direction A rotated by 45° clockwise. The first sub-pixel 01 may be symmetrical with respect to the extension of the diagonal direction C. That is, the first sub-pixel 01 is an axisymmetric pattern, the direction of the symmetrical axis of the first sub-pixel 01 is the direction of the row direction A rotated by 45° clockwise. The second sub-pixel 02 may be a symmetrical shape with respect to the extension of the diagonal direction C. That is, the second sub-pixel 02 is an axisymmetric pattern, and the direction of the symmetrical axis of the second sub-pixel 02 is the direction of the row direction A rotated by 45° clockwise. Of course, in the specific implementation, each sub-pixel may also be asymmetrical patterns with respect to the diagonal direction C, which is not limited herein.

Optionally, in the pixel arrangement structure provided in one embodiment of the present disclosure, as shown in FIGS. 1 to 6, the shapes of all the third sub-pixels 03 may be the same convex polygon. Thus, in any luminescent pixel composed of the first sub-pixel 01, the second sub-pixel 02, and the third sub-pixel 03, the light-emitting areas of the third sub-pixels 03 are the same. Also, it can be guaranteed that each third sub-pixel 03 has the same aperture ratio to achieve the same brightness decay speed.

Figure 2:
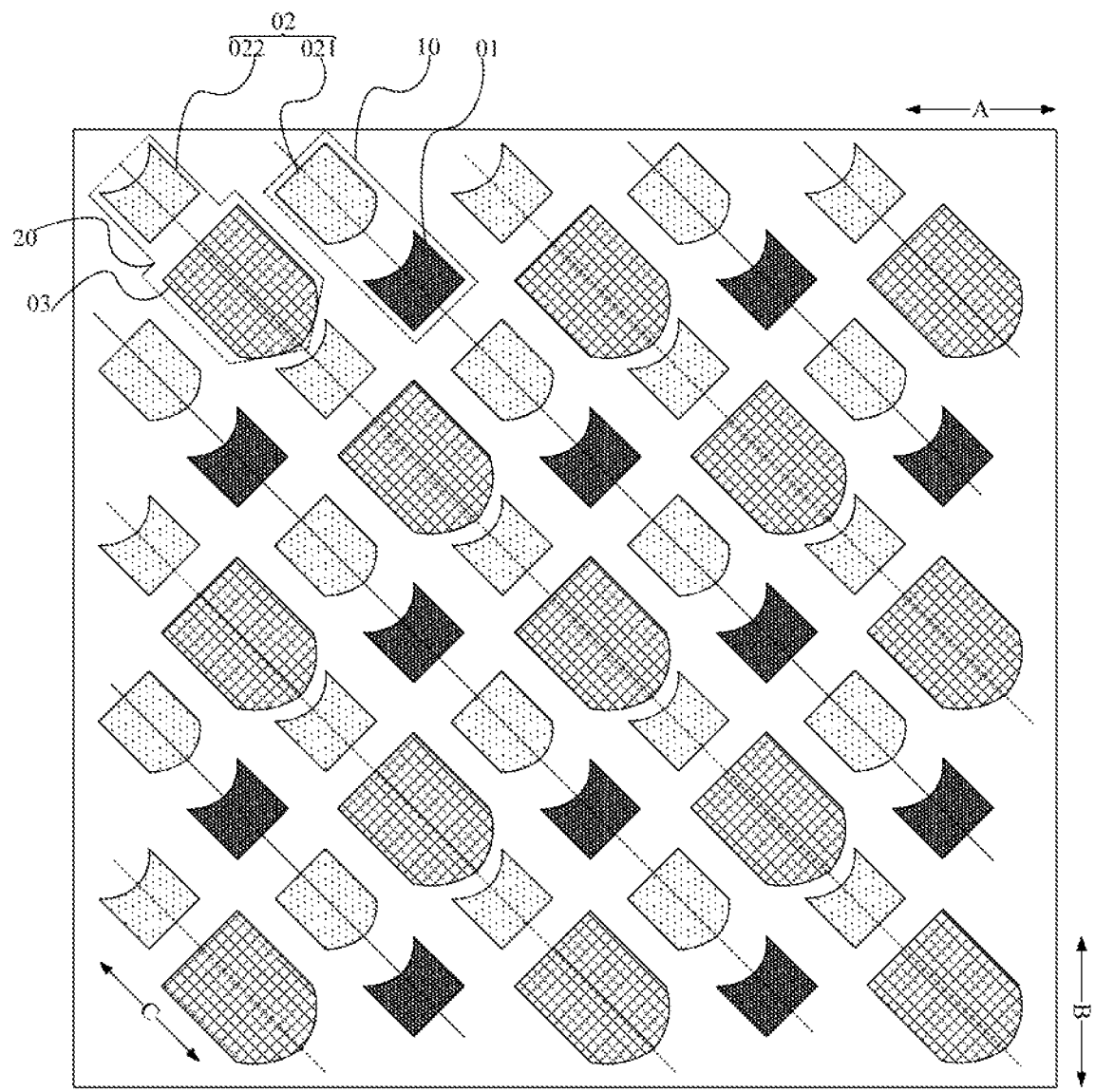
FIG. 2 is a schematic diagram of a pixel arrangement structure according to an embodiment of the present disclosure.

Optionally, in the pixel arrangement structure provided by one embodiment of the present disclosure, as shown in FIG. 1 to FIG. 2, the shapes of all the first sub-pixels 01 may be the same concave polygon. Thus, in any luminescent pixel composed of the first sub-pixel 01, the second sub-pixel 02, and the third sub-pixel 03, the light-emitting areas of the first sub-pixels 01 are the same. Also, it can be ensured that each first sub-pixel 01 has the same aperture ratio to achieve the same brightness decay speed.

Optionally, in the pixel arrangement structure provided by one embodiment of the present disclosure, as shown in FIG. 1 and FIG. 2, when all third sub-pixels 03 have the same convex polygon shape, and all the first sub-pixels 01 have the same concave polygon shape, the shapes of the third sub-pixel 03 and the first sub-pixel 01 may constitute complementary patterns. Complementary patterns mean that the two patterns can be substantially combined to form a new pattern such as a rectangle. That is, the convex pattern N of the third sub-pixel 03 is similar to the lacking sub-pattern P of the first sub-pixel 01. Similar patterns mean that the contours of the two patterns are similar in shape, but the sizes of the two patterns may be different. Specifically, the convex pattern N or the sub-pattern P may be a triangle as shown in FIG. 1 or a semi-circular shape as shown in FIG. 2. Of course, they may be a fan shape or the like, which is not limited herein.

Optionally, in the pixel arrangement structure provided in one embodiment of the present disclosure, as shown in FIG.

Figure 4:
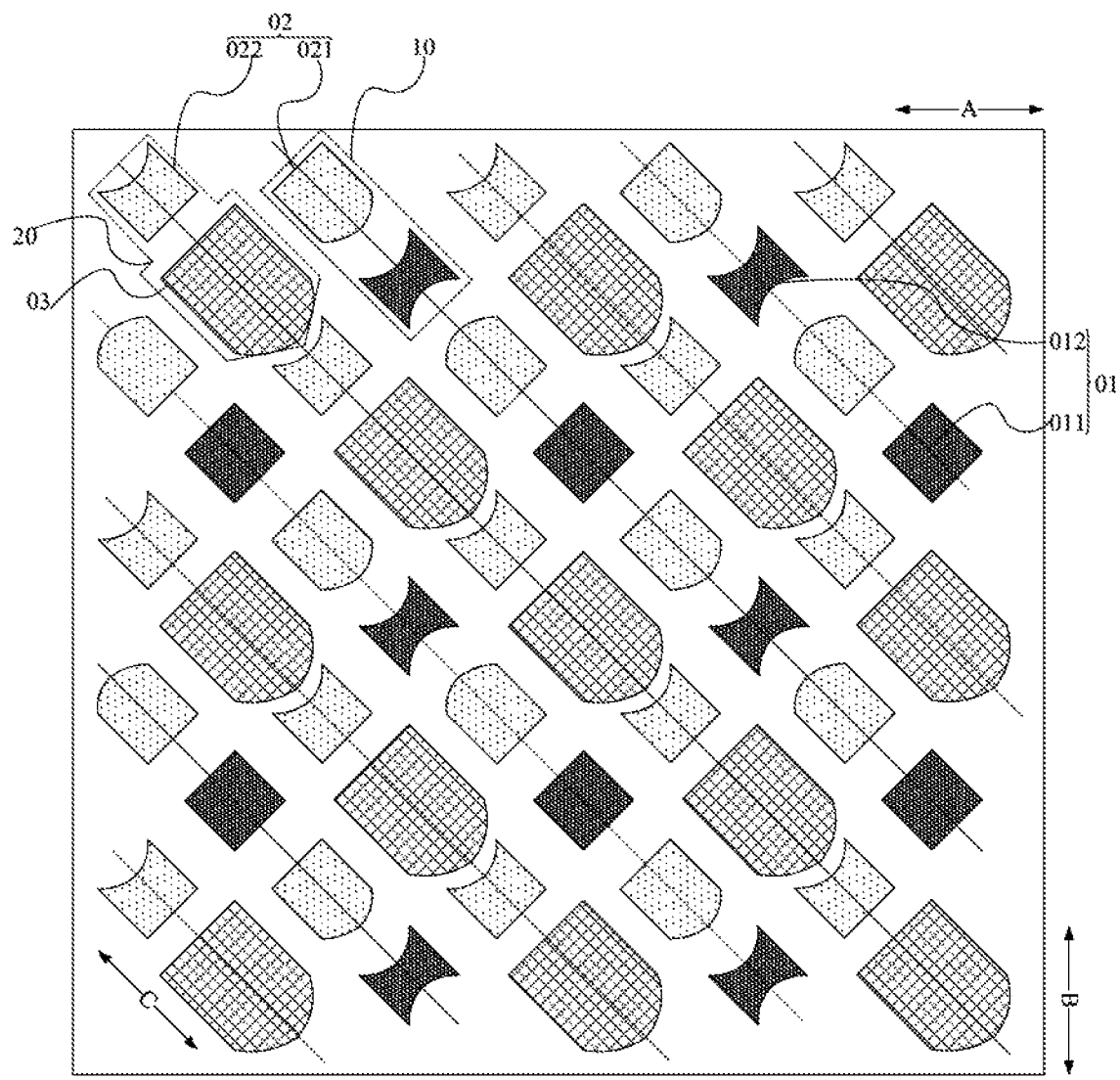
FIG. 4 is a schematic diagram of a pixel arrangement structure according to an embodiment of the present disclosure.

3 and FIG. 4, the first sub-pixels 01 may include a first-type sub-pixel 011 and a second-type sub-pixel 012. The shape of the first-type sub-pixel 011 is different from that of the second-type sub-pixel 012, and the area of the first-type sub-pixel 011 is larger than the area of the second-type sub-pixel 012. The shape of the first sub-pixel 01 is not limited to the two shapes of the first-type sub-pixel 011 and the second-type sub-pixel 012. The first sub-pixel 01 may also include other sub-pixels with different shapes. It is not limited here.

Figure 3:
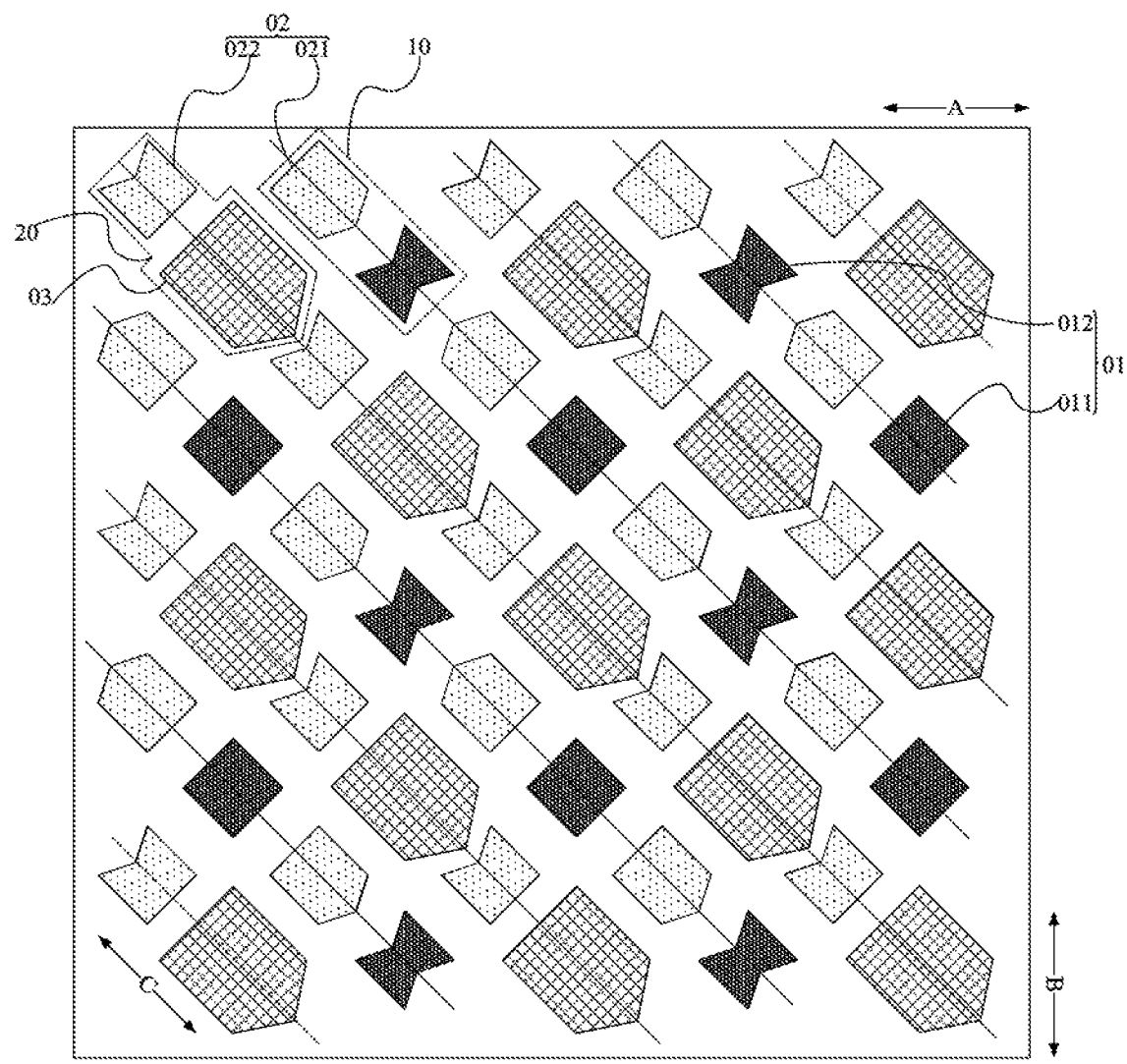
FIG. 3 is a schematic diagram of a pixel arrangement structure according to an embodiment of the present disclosure.

In one embodiment, a sum of areas of the first sub-pixels 01 shown in FIG. 3 and FIG. 4, that is, the aperture ratio, is the same as a sum of areas of the first sub-pixel 01 shown in FIGS. 1 and 2, that is, the aperture ratio. Thus, on the basis of the shape of the first sub-pixel 01 shown in FIG. 1 and FIG. 2, the lacking portion of the pattern of the second-type sub-pixel 012 can be added to the pattern of the first-type sub-pixel 011.

Based on this, optionally, in the above pixel arrangement structure provided in the embodiment of the present disclosure, as shown in FIG. 3 and FIG. 4, the shape of the first-type sub-pixel 011 may be that of the base pattern M. The shape of the second-type sub-pixel 012 may be the base pattern minus two opposite sub-patterns. The base patterns in FIG. 3 and FIG. 4 are all rhombic shapes. Alternatively, the shape of the second-type sub-pixel 012 may also be the base pattern minus two adjacent sub-patterns, which is not limited herein.

Optionally, in the pixel arrangement structure provided in one embodiment of the present disclosure, as shown in FIG. 3 and FIG. 4, the first-type sub-pixel 011 and the second-type sub-pixel 012 are arranged in the row direction A and the column direction B, respectively. The rows of first-type sub-pixel 011 and the second-type sub-pixel 012 are alternately arranged, and the columns of the first-type sub-pixel 011 and the second-type sub-pixel 012 are alternately arranged, which can ensure uniformity of overall brightness of the display panel.

Optionally, in the pixel arrangement structure provided in one embodiment of the present disclosure, to match the shape adjustment of the first sub-pixel 01 and the third sub-pixel 03, as shown in FIG. 1 to FIG. 4, the second sub-pixels 02 may include a third-type sub-pixel 021 and a fourth-type sub-pixel 022. The shape of the third-type sub-pixel 021 is different from that of the fourth-type sub-pixel 022, and the area of the third-type sub-pixel 021 is larger than that of the fourth-type sub-pixel 022.

Optionally, in the pixel arrangement structure provided in one embodiment of the present disclosure, the third-type sub-pixel 021 and the fourth-type sub-pixel 022 are alternately arranged in the row direction A and the column direction B respectively, so that the homogeneity of the overall brightness of the display panel can be ensured.

Optionally, in the pixel arrangement structure provided by one embodiment of the present disclosure, as shown in FIGS. 1 to 4, the shape of the third-type sub-pixel 021 may be the same as the shape of the third sub-pixel 03. In this way, the sides of the third-type sub-pixel 021 may form substantially complementary patterns with the opposite sides of the adjacent first sub-pixel 01 to reduce the spacing between the two.

Optionally, in the pixel arrangement structure provided by one embodiment of the present disclosure, as shown in FIGS. 1 to 4, the shape of the fourth-type sub-pixel 022 is the same as the shape of the first sub-pixel 01. That is, both are concave polygons. In this way, the sides of the fourth-type sub-pixel can form substantially complementary patterns with the sides of the adjacent third sub-pixel 03 to reduce the spacing between the two.

Optionally, in the pixel arrangement structure provided by one embodiment of the present disclosure, as shown in FIG. 1, the shapes of the third sub-pixel 03 and the third-type sub-pixel 021 may respectively be convex pentagons. Two interior angles of the convex pentagonal are respectively about 90°, and the other three interior angles are respectively greater than about 90°.

In one embodiment, the shape of the first sub-pixel 01 and the fourth-type sub-pixel 022 may respectively be a concave pentagon. Two interior angles of the concave pentagon are respectively about 90°, one interior angle is greater than about 180°, and the other two interior angles are respectively acute angles.

In one embodiment, the symmetrical axes of the convex pentagon and the concave pentagon are respectively the vertical direction rotated by 45° counterclockwise.

Optionally, in the pixel arrangement structure provided by one embodiment of the present disclosure, as shown in FIG. 2, the opposite sides of the convex pentagon and the concave pentagon are substantially complementary to each other.

Optionally, in the pixel arrangement structure provided in one embodiment of the present disclosure, as shown in FIG. 3, the shapes of the third sub-pixel 03 and the third-type sub-pixel 021 may respectively be a convex pentagon. Two interior angles of the convex pentagonal shape are respectively about 90°, and the other three interior angles are respectively greater than about 90°.

In one embodiment, the shape of the fourth-type sub-pixel 022 may be a concave pentagon. Two interior angles of the concave pentagon are respectively about 90°, one interior angle is greater than 180°, and the other two interior angles are respectively acute angles.

In one embodiment, the shape of the first-type sub-pixel 011 is a rhombus. The shape of the second-type sub-pixel 012 may be a concave hexagon. Four interior angles of the concave hexagon are respectively acute angles, and two interior angles are respectively obtuse angles.

In one embodiment, the symmetrical axes of the convex pentagon, concave pentagon, rhombus, and concave hexagon are respectively a vertical direction rotated by 45° counterclockwise.

Optionally, in the pixel arrangement structure provided in one embodiment of the present disclosure, as shown in FIG. 4, the opposite sides of the convex pentagon and the concave pentagon can form substantially complementary curves. The opposite sides of the convex hexagons and the concave hexagons can form substantially complementary curves.

Optionally, in the pixel arrangement structure provided in one embodiment of the present disclosure, at least some of first sub-pixels have a shape of rectangle, at least some of second sub-pixels have a shape of rectangle, and/or at least some of third sub-pixels have a shape of a rectangle. The rectangular first sub-pixels, the rectangular second sub-pixels, and/or the rectangular third sub-pixels are uniformly distributed in the pixel arrangement structure.

Based on the same inventive concept, an embodiment of the present disclosure further provides an OLED display panel including the pixel arrangement structure provided by one embodiment of the present disclosure. Since the principle of the OLED display panel solving the problem is similar to that of the aforementioned pixel arrangement structure, the implementation of the OLED display panel can refer to the implementation of the foregoing arrangement of pixels, and the repeated description is omitted.

Based on the same inventive concept, an embodiment of the present disclosure further provides a high-precision metal mask, which is used for manufacturing the above-mentioned pixel arrangement structure provided by one embodiment of the present disclosure. The high-precision metal mask may include a plurality of uniformly distributed opening areas. The shape and position of the opening areas correspond to those of the first sub-pixel, the second sub-pixel, or the third sub-pixel respectively.

Based on the same inventive concept, an embodiment of the present disclosure further provides a display apparatus comprising any one of the above-mentioned OLED display panels provided by the embodiments of the present disclosure. The display apparatus may be any product or component having a display function such as a mobile phone, a tablet computer, a television, a monitor, a notebook computer, a digital photo frame, a navigator, and the like. For the implementation of the display apparatus, reference may be made to the above embodiment of the display panel, and the repeated description is omitted.

The embodiments of the present disclosure provide a pixel arrangement structure, an organic light emitting diode display panel, a high-precision metal mask, and a display apparatus. In the pixel arrangement structure, a plurality of first repeat units and a plurality of second repeat units alternately arranged in both row and column directions. The first repeat unit includes a first sub-pixel or a second sub-pixel. The second repeat unit includes a third sub-pixel or a second sub-pixel. The second sub-pixel is uniformly distributed in an array. Every four second sub-pixels surround a first sub-pixel or a third sub-pixel. At least some of the first sub-pixels are concave polygons, and at least some of the third sub-pixels are convex polygons. Compared with the existing pixel arrangement structure, the present pixel arrangement can arrange the first sub-pixel, the second sub-pixel, and the third sub-pixel more closely and reduce the spacing between the adjacent sub-pixels as much as possible under the same process conditions. As such, under the same resolution, the area of the pixel opening is increased and the driving current of the display apparatus is reduced, thereby increasing the lifetime of the display apparatus. In addition, by reducing the area of the first sub-pixel, i.e., the aperture ratio, in a manner of using the shape of concave polygon, the reduced aperture ratio of the first sub-pixel can be added to a third sub-pixel by changing the shape of the third sub-pixel to a convex polygon. The faster brightness decay of the third sub-pixel is compensated by increasing the aperture ratio to balance the difference in brightness decay speed among the sub-pixels, thereby increasing the lifetime of the display apparatus.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A pixel structure, comprising a plurality of first repeating units and a plurality of second repeating units alternately arranged in both a first direction and a second direction respectively;

wherein each of the plurality of the first repeating units comprises a first sub-pixel or a second sub-pixel, each of the plurality of the second repeat units comprises a third sub-pixel or a second sub-pixel, second sub-pixels are uniformly distributed in an array, at least some of first sub-pixels have a shape of a concave polygon, and at least some of third sub-pixels have a shape of a convex polygon.

2. The pixel structure according to claim 1, wherein four second sub-pixels surround one first sub-pixel or one third sub-pixel, which is adjacent to the four sub-pixels.

3. The pixel structure according to claim 1, wherein the convex polygon comprises a first base pattern and at least one convex pattern protruding from the base pattern; the concave polygon comprises a second base pattern minus at least one sub-pattern; and a contour of the convex pattern and a contour of the sub-pattern have similar patterns.

4. The pixel structure according to claim 3, wherein the convex polygon and the concave polygon are substantially complementary to each other.

5. The pixel structure according to claim 4, wherein each of the third sub-pixels is an axisymmetric pattern, each of the first sub-pixels is an axisymmetric pattern, and each of the second sub-pixels is an axisymmetric pattern.

6. The pixel structure according to claim 5, wherein a symmetrical axis of each of the third sub-pixels is substantially in the first direction rotated clockwise by an angle in a range of 40°-50°;

a symmetrical axis of each of the first sub-pixels is substantially in the first direction rotated clockwise by an angle in a range of 40°-50°; and a symmetrical axis of each of the second sub-pixels is substantially in the first direction rotated clockwise by an angle in a range of 40°-50°.

7. The pixel structure according to claim 1, wherein all the third sub-pixels have the same shape of the convex polygon.

8. The pixel structure according to claim 7, wherein the second sub-pixel comprises a third-type sub-pixel or a fourth-type sub-pixel, the third-type sub-pixel and the fourth-type sub-pixel have different shapes, and an area of the third-type sub-pixel is larger than an area of the fourth-type sub-pixel.

9. The pixel structure according to claim 8, wherein shapes of the third sub-pixel and the first sub-pixel are substantially complementary to each other.

10. The pixel structure according to claim 8, wherein all the first sub-pixels have the same shape of the concave polygon.

11. The pixel structure according to claim 8, wherein the third sub-pixel is substantially complementary to at least one adjacent second sub-pixel; and the first sub-pixel is substantially complementary to at least one adjacent second sub-pixel.

12. The pixel structure according to claim 8, wherein the first sub-pixel comprises a first-type sub-pixel or a second-type sub-pixel, the first-type sub-pixel and the second-type sub-pixel have different shapes, and an area of the first-type sub-pixel is larger than an area of the second-type sub-pixel.

13. The pixel structure according to claim 8, wherein the first-type sub-pixel has a shape of the second base pattern, and the second-type sub-pixel has a shape of the second base pattern minus two opposite sub-patterns.

14. The pixel structure according to claim 8, wherein the first-type sub-pixels are arranged in a line of the first direction and a line of the second direction respectively, the second-type sub-pixels are arranged in the line of the first direction and the line of the second direction respectively, a line of first-type sub-pixels in the first direction and a line of the second-type sub-pixels in the first direction are alternately arranged in the second direction, and a line of the first-type sub-pixels in the second direction and a line of the second-type sub-pixels in the second direction are alternately arranged in the first direction.

15. The pixel structure according to claim 13, wherein the third-type sub-pixels and the fourth-type sub-pixels are alternately arranged in the first direction and the second direction respectively.

16. The pixel structure according to claim 15, wherein the third-type sub-pixel and the third sub-pixel have a same shape and/or the fourth-type sub-pixels and the first sub-pixel have a same shape.

17. The pixel structure according to claim 16, wherein the third sub-pixel and the third-type sub-pixel have a same shape of a convex pentagon, two interior angles of the convex pentagon are respectively about 90°, and the other three interior angles are respectively greater than about 900; and the first sub-pixel and the fourth-type sub-pixel have a same shape of a concave pentagon, two interior angles of the concave pentagon are respectively about 90°, one interior angle is greater than 180°, and the other two interior angles are respectively acute angles.

18. The pixel structure according to claim 1, wherein a ratio of a maximum distance and a minimum distance between opposite sides of the third sub-pixel and the adjacent second sub-pixel is in a range of 1 to 1.5; and a ratio of a maximum distance and a minimum distance between opposite sides of the first sub-pixel and the adjacent second sub-pixel is in a range of 1 to 1.5.

19. The pixel structure according to claim 18, wherein the opposite sides of the third sub-pixel and the adjacent second sub-pixel are substantially parallel to each other; and the opposite sides of the first sub-pixel and the adjacent second sub-pixel are substantially parallel to each other.

20. A display apparatus, comprising a display panel comprising the pixel structure according to claim 1.

* * * * *